US012648443B2

(12) United States Patent
Pitts

(10) Patent No.: US 12,648,443 B2
(45) Date of Patent: Jun. 2, 2026

(54) WEAVED PYROLYTIC GRAPHITE SHEETS FOR HEAT SPREADING

(71) Applicant: Raytheon Company, Waltham, MA (US)

(72) Inventor: Andrew J. Pitts, Carlisle, MA (US)

(73) Assignee: RAYTHEON COMPANY, Waltham, MA (US)

( * ) Notice: Subject to any disclaimer, the term of this patent is extended or adjusted under 35 U.S.C. 154(b) by 370 days.

(21) Appl. No.: 18/458,716

(22) Filed: Aug. 30, 2023

(65) Prior Publication Data

US 2024/0172400 A1 May 23, 2024

Related U.S. Application Data

(60) Provisional application No. 63/426,567, filed on Nov. 18, 2022.

(51) Int. Cl.
*H05K 7/20* (2006.01)
*H10W 40/25* (2026.01)

(52) U.S. Cl.
CPC ...... *H10W 40/257* (2026.01); *H05K 7/20509* (2013.01); *H10W 40/25* (2026.01)

(58) Field of Classification Search
CPC .... D03D 1/00; D03D 15/275; D10B 2401/04; D10B 2505/00; F28F 2013/001; F28F 2013/006; F28F 2013/008; H01L 23/373; H01L 23/3733; H05K 7/20509; H10W 40/257
See application file for complete search history.

(56) References Cited

U.S. PATENT DOCUMENTS

| | | | | | |
|---|---|---|---|---|---|
| 5,296,310 | A | * | 3/1994 | Kibler | H01L 23/3735 428/614 |
| 6,060,166 | A | * | 5/2000 | Hoover | F28F 13/00 165/83 |
| 6,837,306 | B2 | * | 1/2005 | Houle | H01L 21/4882 428/297.4 |
| 8,475,923 | B2 | * | 7/2013 | Katayama | H01L 23/3735 361/708 |

(Continued)

FOREIGN PATENT DOCUMENTS

EP 3395607 A1 10/2018

OTHER PUBLICATIONS

International Search Report with Written Opinion issued in International Application No. PCT/US2023/036660; International Filing Date Nov. 2, 2023; Date of Mailing Mar. 18, 2024 (12 pages).

(Continued)

*Primary Examiner* — Eric S Ruppert
*Assistant Examiner* — Hans R Weiland
(74) *Attorney, Agent, or Firm* — CANTOR COLBURN LLP

(57) ABSTRACT

A heat spreading element is provided and includes first and second pyrolytic graphite sheets (PGSs) arranged to form an opening between respective proximal ends thereof and a weaved PGS. The weaved PGS includes a first section disposed above the first PGS, a second section disposed below the second PGS and a weaved section extending between respective proximal ends of the first and second sections and through the opening.

20 Claims, 7 Drawing Sheets

(56) References Cited

U.S. PATENT DOCUMENTS

| | | | | |
|---|---|---|---|---|
| 2003/0116312 A1* | 6/2003 | Krassowski | ............ | F28F 13/00 |
| | | | | 165/905 |
| 2007/0053168 A1* | 3/2007 | Sayir | .................... | H01L 23/367 |
| | | | | 257/E23.105 |
| 2008/0019097 A1* | 1/2008 | Zhang | .................... | F28F 13/00 |
| | | | | 361/704 |
| 2011/0045300 A1* | 2/2011 | Tamaoki | ................. | C01B 32/21 |
| | | | | 156/60 |
| 2012/0234524 A1* | 9/2012 | Fan | ........................ | B32B 9/007 |
| | | | | 165/185 |
| 2018/0281641 A1* | 10/2018 | Durkee | ................ | B60N 2/5692 |
| 2019/0101960 A1* | 4/2019 | Silvanto | ................. | G06F 1/181 |
| 2019/0154360 A1* | 5/2019 | Fan | ........................... | F28F 1/04 |
| 2019/0295918 A1* | 9/2019 | Trulli | ..................... | H01L 23/66 |
| 2020/0278161 A1* | 9/2020 | Maekawa | ........... | H01L 23/3733 |
| 2020/0307158 A1* | 10/2020 | Sinfield | ................... | B32B 37/06 |
| 2022/0000191 A1* | 1/2022 | Cauchy | ............... | B60N 2/5635 |

OTHER PUBLICATIONS

Gaier et al., "The electrical and thermal conductivity of woven pristine and intercalated graphite fiber-polymer composites" Carbon 41.12 (Jan. 2003): pp. 2187-2193.

Hemrick et al., "Woven graphite fiber structures for use in ultra-light weight heat exchangers" Carbon 49.14 (Nov. 2011) Abstract Only (3 pages).

Li et al., "Multifunctional graphene woven fabrics" Scientific reports 2.1 (May 2012): 395 (8 pages).

\* cited by examiner

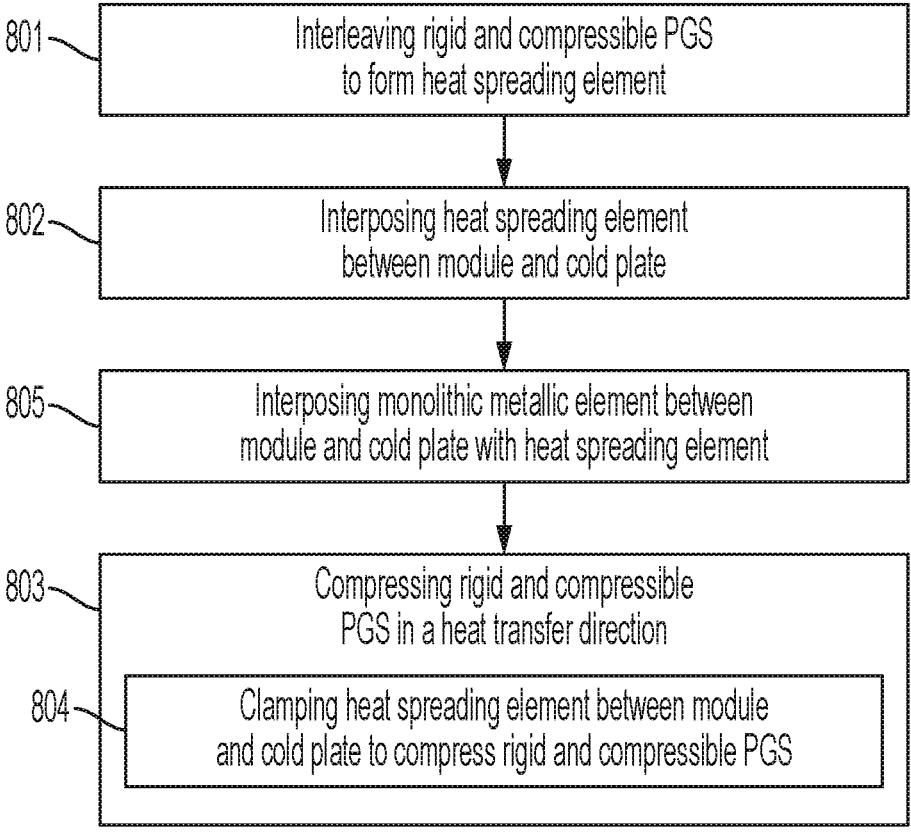

801 — Interleaving rigid and compressible PGS to form heat spreading element

802 — Interposing heat spreading element between module and cold plate

805 — Interposing monolithic metallic element between module and cold plate with heat spreading element 803 — Compressing rigid and compressible PGS in a heat transfer direction 804 — Clamping heat spreading element between module and cold plate to compress rigid and compressible PGS

FIG. 8

WEAVED PYROLYTIC GRAPHITE SHEETS FOR HEAT SPREADING

CROSS-REFERENCE TO RELATED APPLICATIONS

This application claims the benefit of U.S. Application No. 63/426,567 filed Nov. 18, 2022, the disclosure of which is incorporated herein by reference in its entirety.

BACKGROUND

The present disclosure relates to heat spreading and, in particular, to heat spreading with weaved pyrolytic graphite sheets (PGS).

A heat spreader is an assembly that is used to transfer heat, which is generated by an electronic device or module, from the electronic device or module in a first direction and to spread that heat out in second directions. In some cases, the heat spreader includes the module, a cold plate or a heat exchanger, and a heat spreading element interposed between the module and the cold plate. The heat spreading element transfers heat generated by the module toward the cold plate and in doing so spreads the heat out.

In conventional heat spreaders, the heat spreading element was provided by monolithic copper spreaders. These monolithic copper spreaders tend to be heavy. As such, conventional heat spreaders that include monolithic copper spreaders tend to be heavy as well.

SUMMARY

According to an aspect of the disclosure, a heat spreading element is provided and includes first and second pyrolytic graphite sheets (PGSs) arranged to form an opening between respective proximal ends thereof and a weaved PGS. The weaved PGS includes a first section disposed above the first PGS, a second section disposed below the second PGS and a weaved section extending between respective proximal ends of the first and second sections and through the opening.

In accordance with additional or alternative embodiments, at least one of the first and second PGSs and the weaved PGS includes multiple PGS layers.

In accordance with additional or alternative embodiments, at least one or more of the first, second and weaved PGSs includes a weave.

In accordance with additional or alternative embodiments, the heat spreading element further includes at least one of additional first PGSs disposed between the first PGS and the first section of the weaved PGS and additional second PGSs disposed above the second PGS and additional second PGSs disposed between the second PGS and the second section of the weaved PGS and additional first PGSs below the first PGS.

In accordance with additional or alternative embodiments, the heat spreading element further includes additional first PGSs disposed between the first PGS and the first section of the weaved PGS and additional second PGSs disposed above the second PGS and additional second PGSs disposed between the second PGS and the second section of the weaved PGS and additional first PGSs below the first PGS.

In accordance with additional or alternative embodiments, the first section of the weaved PGS is parallel with the first PGS, the second section of the weaved PGS is parallel with the second PGS and the weaved section of the weaved PGS is angled with respect to the first and second sections.

In accordance with additional or alternative embodiments, the first section of the weaved PGS is parallel with the first PGS, the second section of the weaved PGS is parallel with the second PGS and the weaved section of the weaved PGS is perpendicular with respect to the first and second sections.

In accordance with additional or alternative embodiments, the first and second PGSs are each arranged to form multiple openings between multiple respective proximal ends thereof and the weaved PGS includes multiple weaved sections respectively extending through corresponding ones of the multiple openings.

According to an aspect of the disclosure, a heat spreading element is provided and includes first and second pyrolytic graphite sheets (PGSs) arranged to form an opening between respective proximal ends thereof and multiple weaved PGSs. Each of the multiple PGSs includes a first section disposed above the first PGS, a second section disposed below the second PGS and a weaved section extending between respective proximal ends of the first and second sections and through the opening.

In accordance with additional or alternative embodiments, at least one of the first and second PGSs and the multiple weaved PGSs includes multiple PGS layers.

In accordance with additional or alternative embodiments, at least one or more of the first and second PGSs and the multiple weaved PGSs includes a weave.

In accordance with additional or alternative embodiments, the heat spreading element includes at least one of additional first PGSs disposed between the first PGS and the first sections of the multiple weaved PGS and above the second PGS and additional second PGSs disposed between the second PGS and the second sections of the multiple weaved PGS and above the first PGS.

In accordance with additional or alternative embodiments, the heat spreading element further incudes additional first PGSs disposed between the first PGS and the first sections of the multiple weaved PGS and above the second PGS and additional second PGSs disposed between the second PGS and the second sections of the multiple weaved PGS and above the first PGS.

In accordance with additional or alternative embodiments, the first sections of the multiple weaved PGSs are parallel with the first PGS, the second sections of the multiple weaved PGS are parallel with the second PGS and the weaved sections of the multiple weaved PGSs are angled with respect to the first and second sections of the multiple weaved PGSs.

In accordance with additional or alternative embodiments, the first sections of the multiple weaved PGSs are parallel with the first PGS, the second sections of the multiple weaved PGSs are parallel with the second PGS and the weaved sections of the multiple weaved PGSs are perpendicular with respect to the first and second sections of the multiple weaved PGSs.

In accordance with additional or alternative embodiments, the first and second PGSs are each arranged to form multiple openings between multiple respective proximal ends thereof and the multiple weaved PGSs include multiple weaved sections respectively extending through corresponding ones of the multiple openings.

According to an aspect of the disclosure, a sandwich structure for an electronic assembly is provided and includes a core assembly including first and second sections and defining an opening between proximal ends thereof, a first pyrolytic graphite sheet (PGSs) disposed below the first section of the core assembly, a second PGS disposed above the second section of the core assembly and a weaved PGS.

The weaved PGS includes a first section disposed above the first section of the core assembly, a second section disposed below the second section of the core assembly and a weaved section extending between respective proximal ends of the first and second sections and through the opening.

In accordance with additional or alternative embodiments, the weaved PGS is provided as an encapsulated annealed PGS.

In accordance with additional or alternative embodiments, at least one or more of the first, second and weaved PGSs includes a weave.

In accordance with additional or alternative embodiments, the sandwich structure further includes clamping plates sandwiching the core assembly, the first and second PGSs and the weaved PGS, a clamping element to clamp the clamping plates together and an electronic device disposed on one of the clamping plates and comprising a mounting boss extending into the core assembly.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts:

FIG. 8 is a flow diagram illustrating a method of assembling a heat spreading in accordance with embodiments;

DETAILED DESCRIPTION

As will be described below, a continuous pyrolytic graphite sheet (PGS) weave creates a spreader via effect that spreads heat efficiently in all directions (3D spreader). Horizontal sheets are rotated vertically to spread heat in the global through-thickness direction, while still in the local sheet in-plane direction. This creates a quasi-isotropic thermal conductivity property from PGS sheets with only two preferred directions for thermal conductivity. The number of woven plies can be optimized to create different effective in-plane and through-thickness thermal conductivity values. In addition, PGS is integrated into a high strength sandwich structure providing high thermal conductivity in the x, y, and z directions. Slots or round holes can be cut into face-sheets of a core assembly to allow the PGS to pass between faces, effectively functioning as a conductive via. Top and bottom clamps compress the PGS to spread heat through the structure. Devices conduct heat through a baseplate into the sheet metal clamps and transfer loads directly to the sandwich composite by passing through the clamp and PGS layers, therefore the thermal and structure feature are uncoupled.

Figure 1:
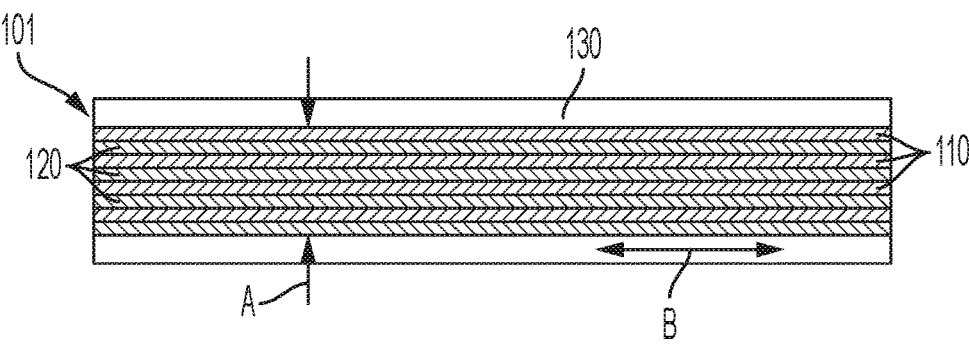
FIG. 1 is a schematic side view of a heat spreading element in accordance with embodiments.

With reference to FIG. 1, a heat spreading element 101 is provided and includes compressible PGS 110 and rigid PGS 120. The rigid PGS 120 are interleaved with the compressible PGS 110. At least one of the compressible PGS 110 and the rigid PGS 120 exhibits in-plane thermal conductivity of greater than about 1000 W/m-K. The compressible PGS 110 and the rigid PGS 120 are much less dense than metallic material, such as copper. For example, a density of the rigid PGS 120 can be less than about 10% a density of metallic material. A density of the compressible PGS 110 can be less than about 10% and, in some cases, less than about 5% a density of metallic material. The compressible PGS 110 and the rigid PGS 120 can be compressed together by, e.g., a clamp 130, in an interleaving direction A. This compression effectively activates the in-plane thermal conductivity of the compressible PGS 110 and the rigid PGS 120 so that the heat spreading element 101 can provide for a transfer of heat in a first direction (i.e., the interleaving direction A) and can spread the heat out in a second direction (i.e., an in-plane direction B).

In accordance with embodiments, the rigid PGS 120 can have a density of about 1200-1300 kg/m3 and the compressible PGS 110 can have a spongy quality with a density of about 400-500 kg/m3.

Figure 2:
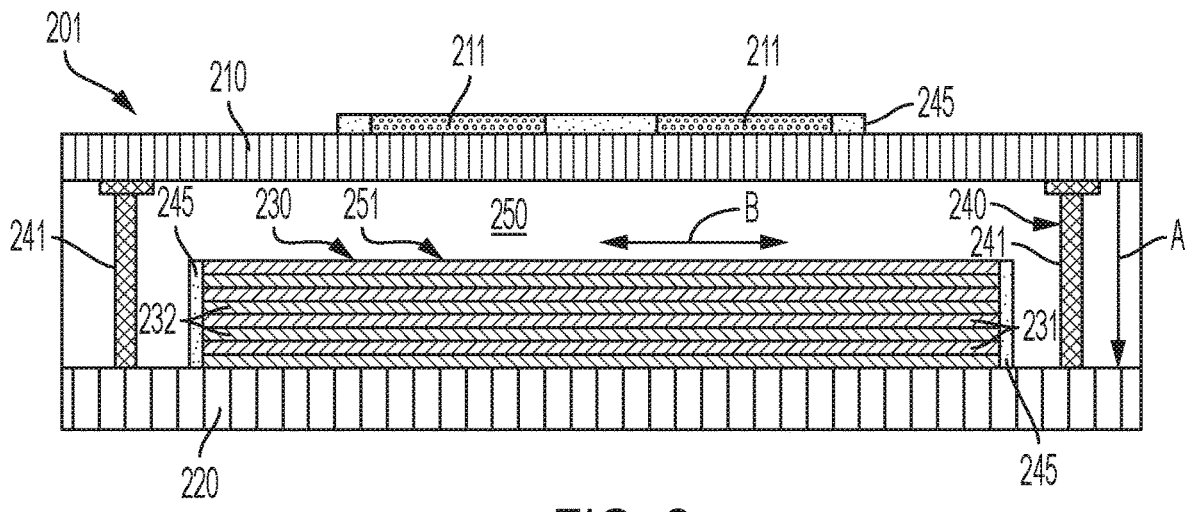
FIG. 2 is a schematic side view of a heat spreader with a heat spreading element in accordance with embodiments.

With reference to FIG. 2, a heat spreader 201 is provided and includes a module 210, which includes electronics 211 that generate heat during operations thereof, a heat exchanger or cold plate (hereinafter referred to as a "cold plate") 220 that is configured to draw and dissipate the heat generated by the electronics 211, a heat spreading element 230 and a clamp 240. The heat spreading element 230 includes compressible PGS 231 and rigid PGS 232 that are interleaved with the compressible PGS 231. At least one of the compressible PGS 231 and the rigid PGS 232 exhibits in-plane thermal conductivity of greater than about 1000 W/m-K. The compressible PGS 231 and the rigid PGS 232 are much less dense than metallic material, such as copper. For example, a density of the rigid PGS 120 can be less than about 10% a density of metallic material. A density of the compressible PGS 110 can be less than about 10% and, in some cases, less than about 5% a density of metallic material.

As above, in accordance with embodiments, the rigid PGS 232 can have a density of about 1200-1300 kg/m3 and the compressible PGS 231 can have a spongy quality with a density of about 400-500 kg/m3.

Figure 3:
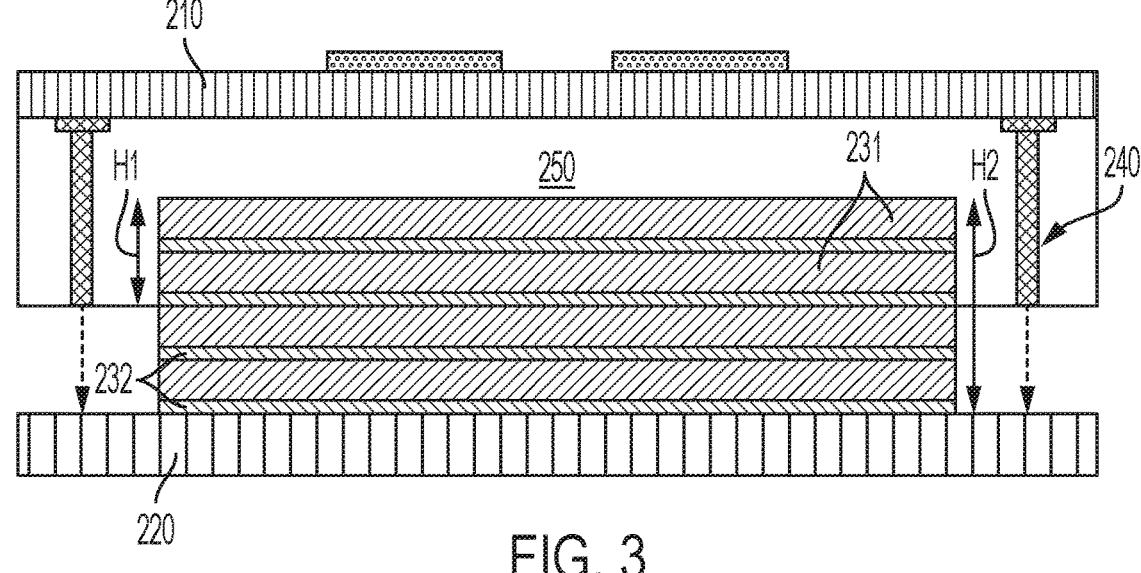
FIG. 3 is a graphical illustration of an assembly of the heat spreader and the heat spreading element of FIG. 2 in accordance with embodiments.

The heat spreading element 230 is interposed between the module 210 and the cold plate 220 to provide for a transfer of the heat generated by the electronics 211 from the module 210 to the cold plate 220 in a first direction (i.e., an interleaving direction A with respect to the interleaving direction of the compressible PGS 231 and the rigid PGS 232). The heat spreading element 230 also spreads the heat out in a second direction (i.e., an in-plane direction B of the compressible PGS 231 and the rigid PGS 232) transverse with respect to the first direction. The clamp 240 can include screws 241 that are engageable with at least the cold plate 220 to draw the cold plate 220 toward the module 210. The clamp 240 can alternatively include or be provided with various other configurations that serve to draw the cold plate 220 toward the module 210. In any case, the clamp 240 serves to clamp the heat spreading element 230 between the module 210 and the cold plate 220 and to compress the compressible PGS 231 and the rigid PGS 232 in the first direction or the interleaving direction A (FIG. 3 illustratively shows that only the compressible PGS 231 are compressed; this is done for clarity and is not necessarily the case). This compression of the compressible PGS 231 and the rigid PGS 232 effectively activates the in-plane thermal conductivity of the compressible PGS 231 and the rigid PGS 232.

In accordance with embodiments, the clamp 240 can be used to compress the compressible PGS 231 and the rigid PGS 232 to tune contact resistances between the compressible PGS 231 and the rigid PGS 232. This can optimize thermal performance of the heat spreading element 230 in general and to optimize thermal performance and the in-plane thermal conductivity of the compressible PGS 231 and the rigid PGS 232.

In accordance with further or alternative embodiments, it is to be understood that the compressible PGS 231 and the rigid PGS 232 need not be interleaved with one another in a 1:1 sequence and that other configurations are possible. These include configurations in which only the compressible PGS 231 are provided and/or configurations in which multiple compressible PGS 232 are interleaved with singular rigid PGS 232.

As shown in FIG. 2, the heat spreader 201 can also include a monolithic metallic element 250 interposed between the module 210 and the cold plate 220 with the heat spreading element 230. The monolithic metallic element 250 can be formed of a metallic material, such as copper or another suitable metal or metallic alloy. The monolithic metallic element 250 can be provided in a number of configurations but is generally provided as a single, unitary element that is formed to define a pocket 251 in which the heat spreading element 230 is disposable. In this sense, the monolithic metallic element 250 can also engage with or be engaged by the clamp 240.

With continued reference to FIG. 2, the heat spreader 201 can also include seals 245. The seals 245 can assume any size, shape and dimension for use with the heat spreader 201. In some, but not all cases, the seals 245 can be disposed and configured to prevent moisture ingress into the heat spreading element 230. In some other cases, the seals 245 can also be disposed and configured to prevent moisture from flowing around the clamp 240 and then into the heat spreading element 230.

With reference to FIG. 3 and in accordance with embodiments, a height H1 of the pocket 251 can be less than a height H2 of the heat spreading element 230 prior to the compressible PGS 231 and the rigid PGS 232 being compressed. Thus, as above, the height H1 of the pocket 251 can be tuned along with the clamp 240 to compress the compressible PGS 231 and the rigid PGS 232 to optimize thermal performance of the heat spreading element 230. That is, where the compressible PGS 231 and the rigid PGS 232 are compressed from the height H2 to the height H1 of the pocket 251, this degree of compression optimizes the thermal performance of the heat spreading element 230.

In accordance with embodiments, a degree of compression can be about 5-60% of the height H2.

The compressibility of the compressible PGS 231 can provide for coefficient of thermal expansion (CTE) mismatch compliance among at least two or more of the module 210, the monolithic metallic element 250, the rigid PGS 232, and the cold plate 220.

Figure 4:
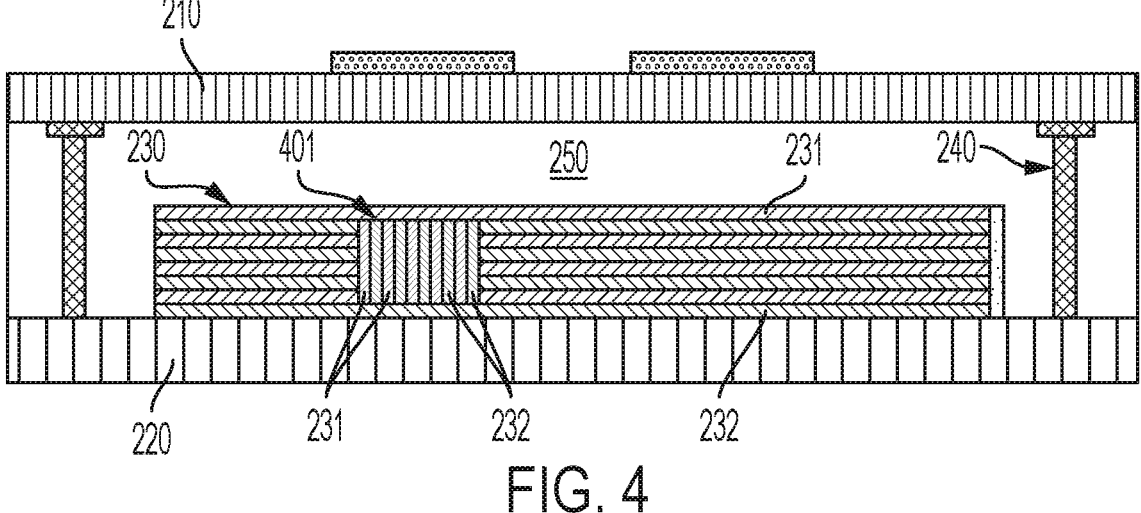
FIG. 4 is a side schematic view of a heat spreader with a heat spreading element and a transverse section in accordance with embodiments.

With reference to FIG. 4 and in accordance with further embodiments, the heat spreading element 230 of FIGS. 2 and 3 can be provided in hybridized configurations, arrangements and formations. For example, as shown in FIG. 4, the heat spreading element 230 can include the compressible PGS 231 and the rigid PGS 232 as well as a transverse section 401. This transverse section 401 can be, but is not required to be, provided within the heat spreading element 230 and can include the compressible PGS 231 and the rigid PGS 232. The compressible PGS 231 and the rigid PGS 232 of the transverse section 401 are oriented or otherwise turned transversely or perpendicularly with respect to a rest of the heat spreading element 230. In this way, the transverse section 401 can function like a via for heat spreading in through-thickness directions (in addition to the in-plane heat spreading of the compressible PGS 231 and the rigid PGS 232). The compressible PGS 231 and the rigid PGS 232 of the transverse section 401 can be compressed (i.e., by the rest of the heat spreading element 230) and thus can provide for a high degree of in-plane thermal conduction between the module 210 and the cold plate 220. This transverse section 401 can be disposed at or near a hot spot of the module 210.

Although the transverse section 401 is illustrated in FIG. 4 as being sandwiched between a compressible pyrolytic graphite sheet 231 and a rigid pyrolytic graphite sheet 232, it is to be understood that this is not required and that other embodiments are possible. For example, the traverse section 401 could be in direct contact with one or both of the cold plate 220 and the monolithic metallic element 250.

Figure 5:
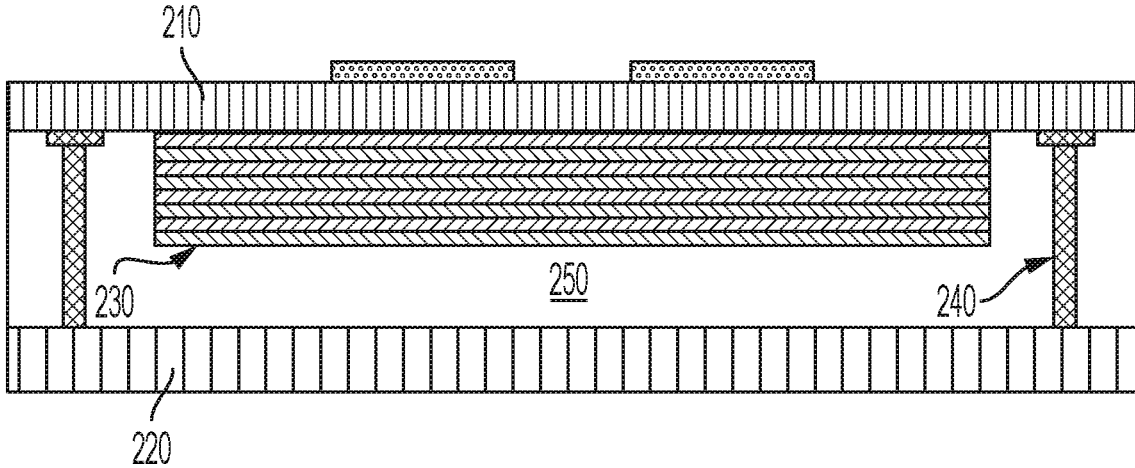
FIG. 5 is a side schematic view of a heat spreader with a heat spreading element in accordance with alternative embodiments.
Figure 6:
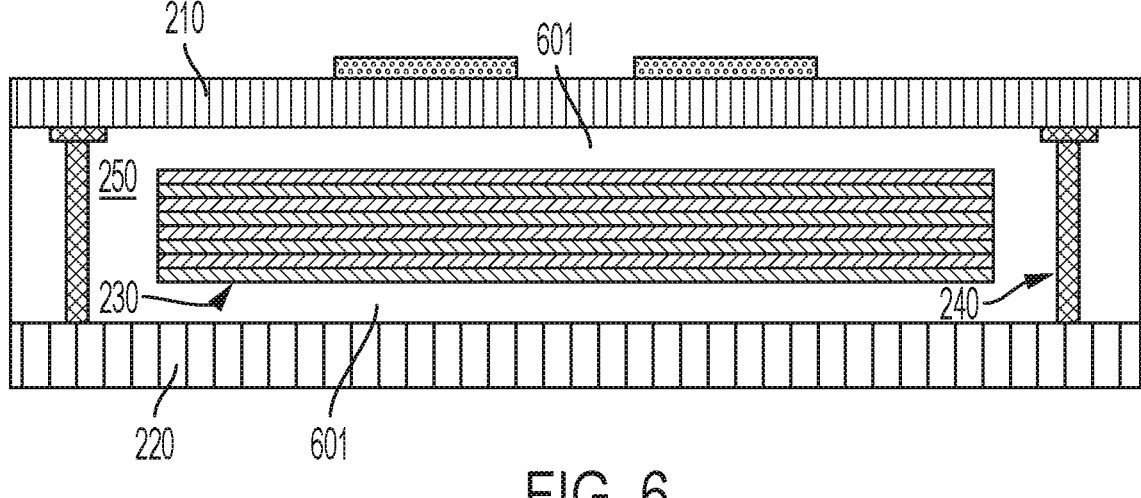
FIG. 6 is a side schematic view of a heat spreader with a heat spreading element in accordance with alternative embodiments.
Figure 7:
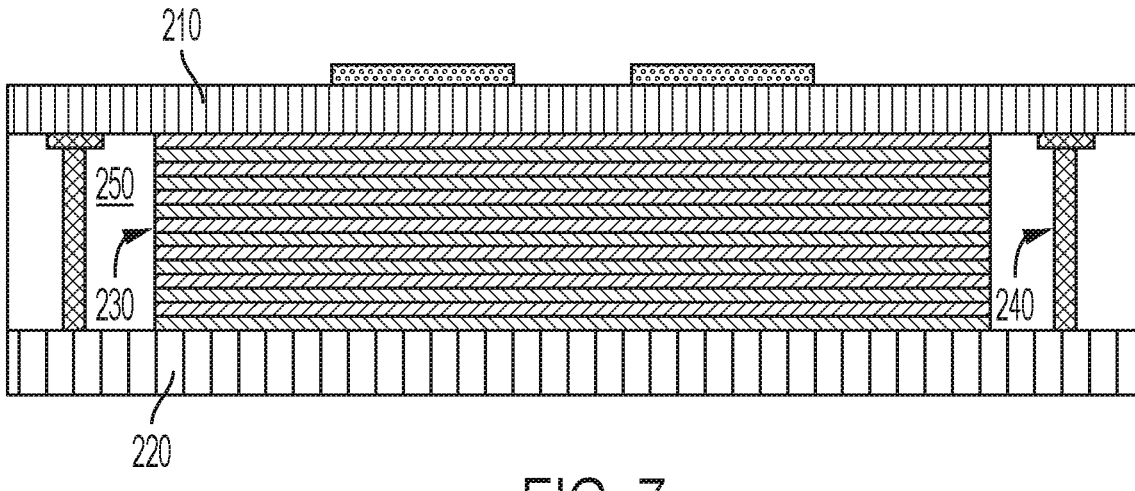
FIG. 7 is a side schematic view of a heat spreader with a heat spreading element in accordance with alternative embodiments.

With reference to FIGS. 5-7 and in accordance with further embodiments, the monolithic metallic element 250 can be formed such that the pocket 251 can have multiple varied configurations. For example, while the pocket 251 of FIGS. 2 and 3 is adjacent to the cold plate 220, the pocket 251 could be adjacent to the module 210 (see FIG. 5), the pocket 251 could be sandwiched on each side by portions 601 of the monolithic metallic element 250 (see FIG. 6) or the pocket 251 could extend through an entire span of the distance between the module 210 and the cold plate 220 (see FIG. 7).

With reference to FIG. 8, a method of assembling a heat spreader, such as the heat spreader 201 described above, is provided. As shown in FIG. 8, the method includes interleaving rigid PGS with compressible PGS to form a heat spreading element to provide for a transfer of heat and to spread the heat out (block 801) and compressing the compressible PGS and the rigid PGS in a direction of the transfer of the heat (block 802). In accordance with embodiments, the method can further include interposing the heat spreading element between a module and a cold plate to provide for the transfer of heat from the module to the cold plate in a first direction and to spread the heat out in a second direction transverse with respect to the first direction (block 803). In addition, the compressing can include clamping the heat spreading element between the module and the cold plate to compress the compressible PGS and the rigid PGS in the first direction (block 804). The method can further include interposing a monolithic metallic element between the module and the cold plate with the heat spreading element (block 805).

Figure 9A:
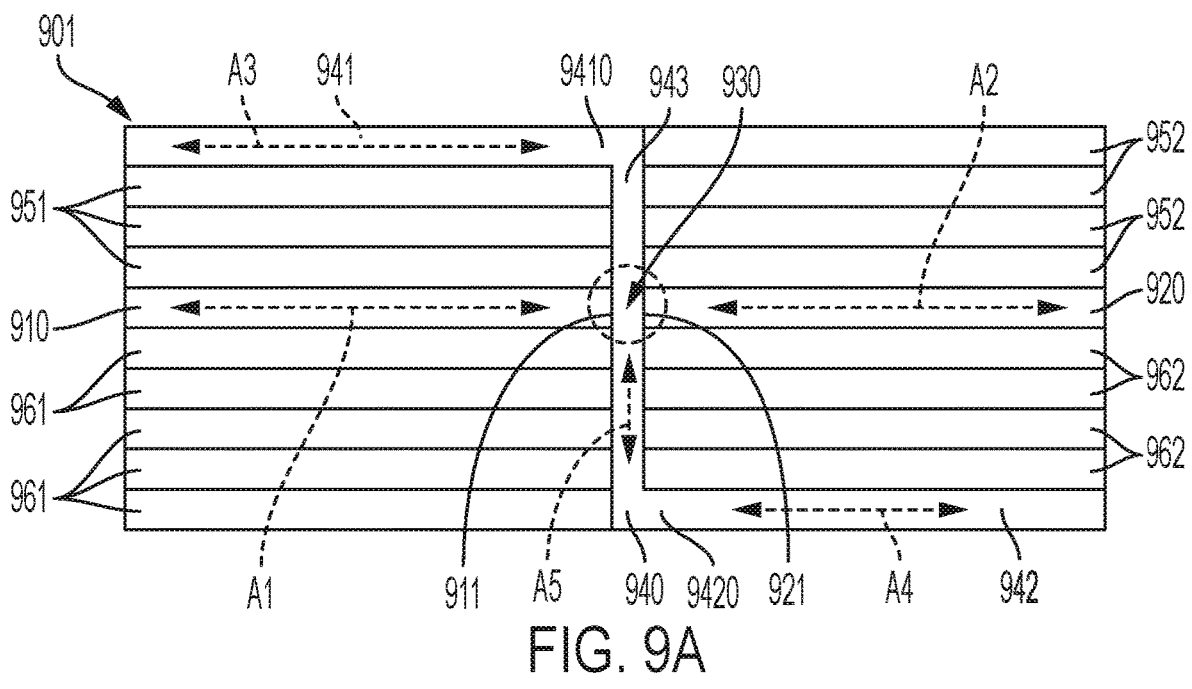
FIG. 9A is a side schematic view of weaved pyrolytic graphite sheets with a single weave layer in accordance with embodiments.
Figure 9B:
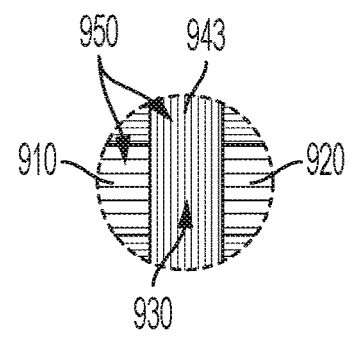
FIG. 9B is an enlarged view of the encircled portion of FIG. 9A in accordance with embodiments.

With reference to FIGS. 9A and 9B, a heat spreading element 901 is provided and includes a first PGS 910 and a second PGS 920. The first and second PGSs 910 and 920 each have proximal ends 911 and 921 and are arranged to form an opening 930 between the proximal ends 911 and 921. The heat spreading element 901 further includes a weaved PGS 940. The weaved PGS 940 includes a first section 941 that is disposed above the first PGS 910, a second section 942 that is disposed below the second PGS 920 and a weaved section 943. The first and second sections 941 and 942 each have proximal ends 9410 and 9420. The weaved section 943 extends between the proximal ends 9410 and 9420 of the first and second sections 941 and 942 and through the opening 930. Additional first PGS layers 951 can be disposed between the first PGS 910 and the first section 941 of the weaved PGS 940 and additional second PGS layers 952 can be disposed above the second PGS 920 to level out an uppermost surface of the heat spreading element 901. Similarly, additional second PGS layers 962 can be disposed between the second PGS 920 and the second section 942 of the weaved PGS 940 and additional first PGS layers 961 can be disposed below the first PGS 941 to level out a lowermost surface of the heat spreading element 901. As shown in FIG. 9B, at least one of the first PGS 910, the second PGS 920 and the weaved PGS 940 (as well as the additional first PGS layers 951, 961 and the additional second PGS layers 952, 962) can include multiple PGS layers 950.

The heat spreading element 901 of FIGS. 9A and 9B can be characterized in that the first section 941 of the weaved PGS 940 is parallel with the first PGS 910, the second section 942 of the weaved PGS 940 is parallel with the second PGS 920 and the weaved section 943 of the weaved PGS 940 is angled or perpendicular with respect to the first and second sections 941 and 942. It is to be understood, however, that other embodiments exist and are encompassed within this disclosure.

As above, the first PGS 910, the second PGS 920 and the weaved PGS 940 exhibit in-plane thermal conductivity of greater than about 1000 W/m-K or about ~400-1,500 W/m-K with a density of about 428-1,200 kg/m$^3$. As such, the first and second PGSs 910 and 920 exhibit high rates of in-plane thermal conductivity along the arrows A1 and A2. The weaved PGS 940 exhibits similarly high rates of in-plane thermal conductivity along the arrows A3 and A4 for the first and second sections 941 and 942 as well as along the arrow A5 for the weaved section 943. Thus, while the heat spreading element 901 is capable of heat spreading in an in-plane direction, the heat spreading element 901 is also capable of heat spreading in an out-of-plane or through-thickness direction at the location of the weaved section 943.

Figure 10:
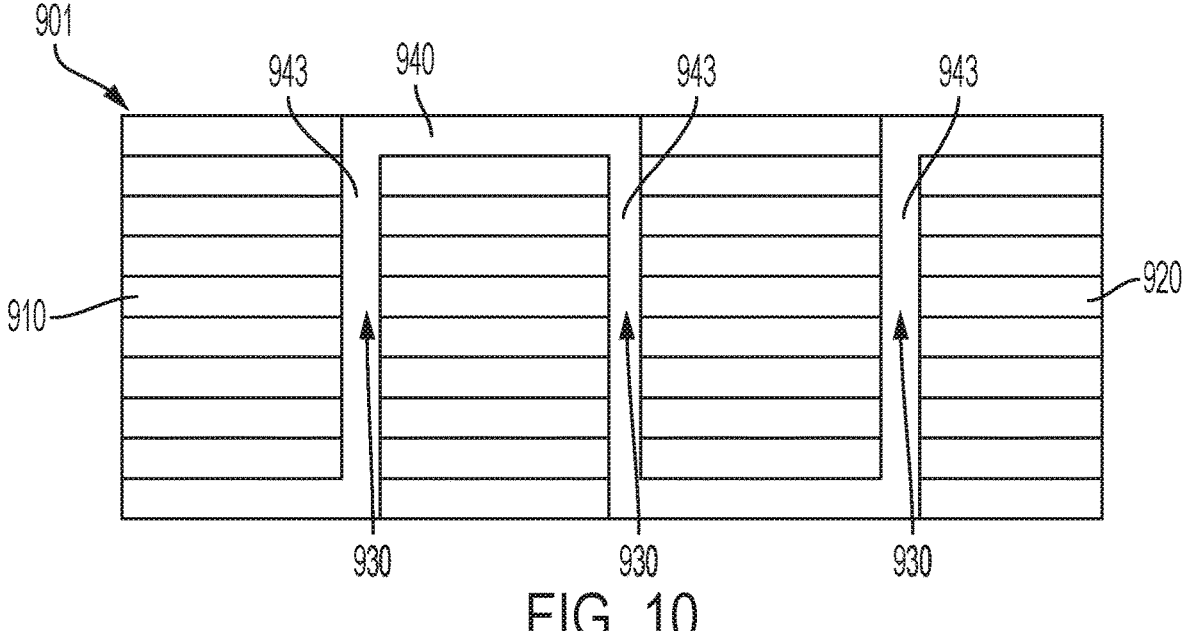
FIG. 10 is a side schematic view of weaved pyrolytic graphite sheets with multiple weave sections in accordance with embodiments.

With reference to FIG. 10, while FIGS. 9A and 9B relate to cases in which the first PGS 910 and the second PGS 920 form a single opening 930 through which a single weaved section 943 extends, this disclosure is not limited thereto and that other embodiments exist. For example, as shown in FIG. 10, the first PGS 910 and the second PGS 920 can be arranged to form multiple openings 930 with multiple weaved sections 943 respectively extending through corresponding ones of the multiple openings 930. In this way, the heat spreading element 901 can have multiple points of out-of-plane heat transfer at the multiple openings 930 and the multiple weaved sections 943.

Figures 11, 12:
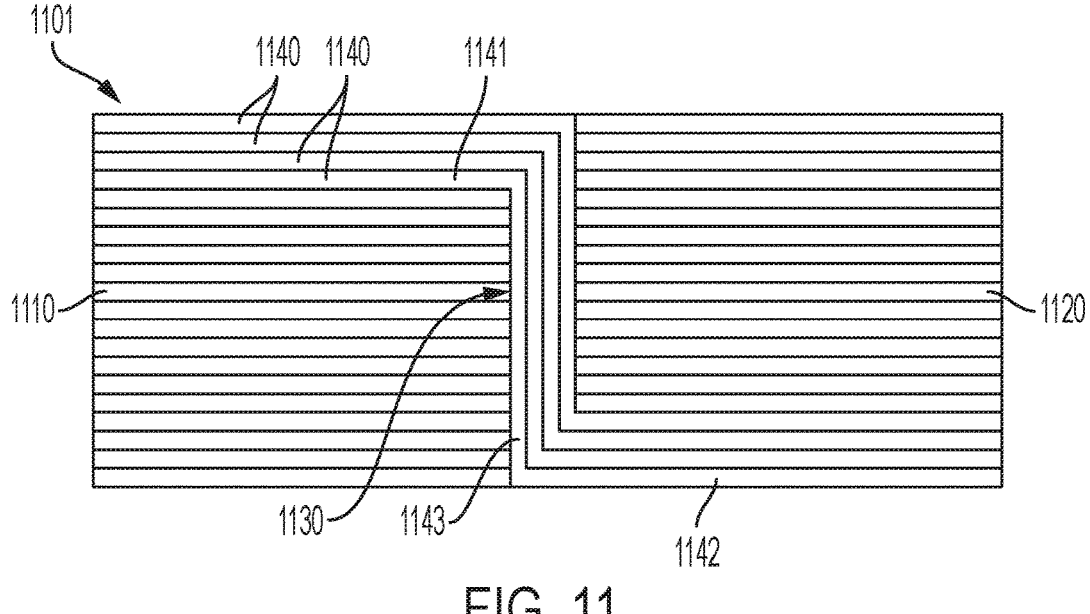
FIG. 11 is a side schematic view of weaved pyrolytic graphite sheets with multiple weave layers in accordance with embodiments.
FIG. 12 is a side view of a sandwich structure in which weaved pyrolytic graphite sheets are included for heat spreading in accordance with embodiments.

With reference to FIG. 11, a heat spreading element 1101 is provided. The heat spreading element 1101 is generally similar to the heat spreading element 901 of FIGS. 9A and 9B and like features need not be described again. The heat spreading element 1101 includes first and second PGSs 1110 and 1120, which are arranged to form an opening 1130 between respective proximal ends thereof, and multiple weaved PGSs 1140. Each of the multiple weaved PGSs includes a first section 1141 that is disposed above the first PGS 1110, a second section 1142 that is disposed below the second PGS 1120 and a weaved section 1143. The weaved section 1143 extends between respective proximal ends of the first and second sections 1141 and 1142 and through the opening 1130.

With reference to FIG. 12, a sandwich structure 1201 for an electronic assembly is provided. The sandwich structure 1201 includes a core assembly 1210, a first PGS 1220, a second PGS 1230 and a weaved PGS 1240. The core assembly 1210 includes face-sheets 12101 sandwiching a core 12102 and includes a first section 1211 and a second section 1212 and is formed to define an opening 1213 between proximal ends of the first section 1211 and the second section 1212. The first PGS 1220 is disposed below the first section 1211 of the core assembly 1210. The second PGS 1230 is disposed above the second section 1212 of the core assembly 1210. The weaved PGS 1240 can be provided as an encapsulated annealed PGS and includes a first section 1241 that is disposed above the first section 1211 of the core assembly 1210, a second section 1242 that is disposed below the second section 1212 of the core assembly 1210 and a weaved section 1243. The weaved section 1243 extends between respective proximal ends of the first section 1241 and the second section 1242 and through the opening 1213 to serve as a thermally conductive via. The sandwich structure 1201 further includes clamping plates 1250 sandwiching the core assembly 1210, the first and second PGSs 1220 and 1230 and the weaved PGS 1240, a clamping element 1251 to clamp the clamping plates 1250 together and an electronic device 1252 disposed on one of the clamping plates 1250 and including a mounting boss 1253 extending into the core assembly 1210.

As above, the first and second PGS 1220 and 1230 and the weaved PGS 1240 exhibit in-plane thermal conductivity of greater than about 1000 W/m-K or about ~400-1,500 W/m-K with a density of about 428-1,200 kg/m$^3$. As such, the first and second PGSs 1220 and 1230 exhibit high rates of in-plane thermal conductivity along the arrows B1 and B2. The weaved PGS 1240 exhibits similarly high rates of in-plane thermal conductivity along the arrows B3 and B4 for the first and second sections 1241 and 1242 as well as along the arrow B5 for the weaved section 1243. Thus, while the sandwich structure 1201 is capable of heat spreading in an in-plane direction, the sandwich structure 1201 is also capable of heat spreading in an out-of-plane or through-thickness direction at the location of the weaved section 1243 (i.e., to transfer heat downwardly from the electronic device 1252).

Figure 13A:
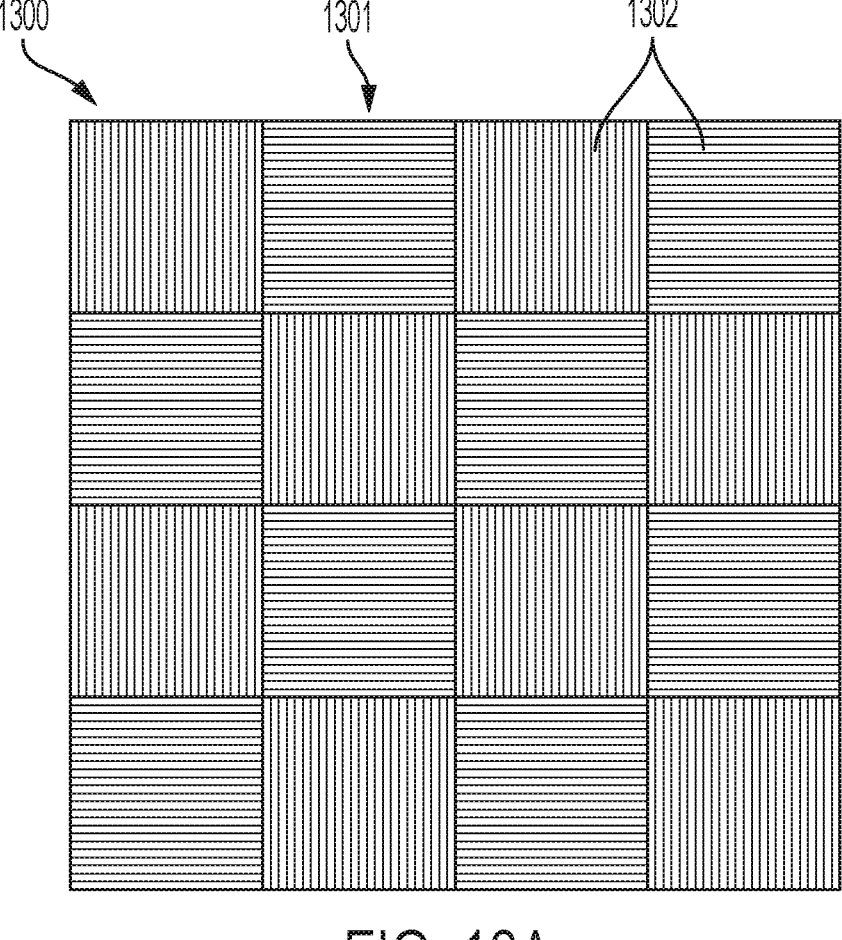
FIGS. 13A and 13B are top-down and in-plane views, respectively, of a weaved sheet of pyrolytic graphite in accordance with embodiments.
Figure 13B:
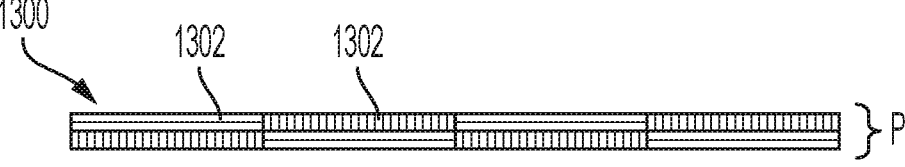

With reference to FIGS. 13A and 13B, any of the PGS described herein including, but not limited to, the first PGS 910, the second PGS 920 and the weaved PGS 940 of FIGS. 9A and 9B and FIG. 10 and the first and second PGSs 1110 and 1120 and the multiple weaved PGSs 1140 of FIG. 11 can be formed themselves of a weave of PGS. For example, as shown in FIG. 13A, a PGS 1300 for use in any of the embodiments described herein can be formed by a weave 1301 of individual PGS elements 1302. The weave 1301 can have any weave pattern, such as the crisscross or over-under pattern illustrated in FIG. 13. In addition, although the PGS 1300 is made up of individual PGS elements 1302, it is to be understood that non-PGS elements can be included in the weave 1301 to achieve certain mechanical or thermal properties. For example, nylon or Kevlar™ sheets can be interwoven in the weave 1301 to increase an overall strength of the PGS 1300. In any case, as shown in FIG. 13B, for each PGS 1300 in a given application, the individual PGS elements 1302 can generally occupy a same overall plane P as the PGS 1300 as a whole.

Technical effects and benefits of the present disclosure are the provision of PGS spreader stack-ups that enable new composite materials to be designed with high effective thermal conductivity and low density. Weaving the PGS material improves the effective through-thickness conductivity of the PGS stack-up, therefore improving the spreading performance of designs utilizing lightweight PGS material. Additional technical effects and benefits of the present disclosure are the provision of a solution to make conventional structural composites thermally conductive.

The corresponding structures, materials, acts, and equivalents of all means or step-plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A heat spreading element, comprising:
a first pyrolytic graphite sheet (PGS) and a second PGS arranged to form an opening between respective proximal ends of the first PGS and of the second PGS with the first PGS disposed on a first side of the opening and the second PGS disposed on a second side of the opening, which is opposite the first side of the opening; and
a weaved PGS comprising:

a first section disposed above the first PGS at the first side of the opening and having a proximal end corresponding to the proximal end of the first PGS;
a second section disposed below the second PGS at the second side of the opening and having a proximal end corresponding to the proximal end of the second PGS; and
a weaved section extending continuously between the respective proximal ends of each of the first and second sections and through the opening.

2. The heat spreading element according to claim 1, wherein at least one of the first and second PGSs and the weaved PGS comprises multiple PGS layers.

3. The heat spreading element according to claim 1, wherein at least one or more of the first, second and weaved PGSs comprises a weave.

4. The heat spreading element according to claim 1, further comprising at least one of:
additional first PGSs disposed between the first PGS and the first section of the weaved PGS and additional second PGSs disposed above the second PGS; and
additional second PGSs disposed between the second PGS and the second section of the weaved PGS and additional first PGSs below the first PGS.

5. The heat spreading element according to claim 1, further comprising:
additional first PGSs disposed between the first PGS and the first section of the weaved PGS and additional second PGSs disposed above the second PGS; and
additional second PGSs disposed between the second PGS and the second section of the weaved PGS and additional first PGSs below the first PGS.

6. The heat spreading element according to claim 1, wherein the first section of the weaved PGS is parallel with the first PGS, the second section of the weaved PGS is parallel with the second PGS and the weaved section of the weaved PGS is angled with respect to the first and second sections.

7. The heat spreading element according to claim 1, wherein the first section of the weaved PGS is parallel with the first PGS, the second section of the weaved PGS is parallel with the second PGS and the weaved section of the weaved PGS is perpendicular with respect to the first and second sections.

8. The heat spreading element according to claim 1, wherein:
the first and second PGSs are each arranged to form multiple openings between multiple respective proximal ends thereof, and
the weaved PGS comprises multiple weaved sections respectively extending through corresponding ones of the multiple openings.

9. A heat spreading element, comprising:
a first pyrolytic graphite sheet (PGS) and a second PGS arranged to form an opening between respective proximal ends of the first PGS and of the second PGS with the first PGS disposed on a first side of the opening and the second PGS disposed on a second side of the opening, which is opposite the first side of the opening; and
multiple weaved PGSs, each comprising:
a first section disposed above the first PGS at the first side of the opening and having a proximal end corresponding to the proximal end of the first PGS;

a second section disposed below the second PGS at the second side of the opening and having a proximal end corresponding to the proximal end of the second PGS; and a weaved section extending continuously between the respective proximal ends of each of the first and second sections and through the opening.

10. The heat spreading element according to claim 9, wherein at least one of the first and second PGSs and the multiple weaved PGSs comprises multiple PGS layers.

11. The heat spreading element according to claim 9, wherein at least one or more of the first and second PGSs and the multiple weaved PGSs comprises a weave.

12. The heat spreading element according to claim 9, further comprising at least one of:

additional first PGSs disposed between the first PGS and the first sections of the multiple weaved PGS and above the second PGS; and additional second PGSs disposed between the second PGS and the second sections of the multiple weaved PGS and above the first PGS.

13. The heat spreading element according to claim 9, further comprising:

additional first PGSs disposed between the first PGS and the first sections of the multiple weaved PGS and above the second PGS; and additional second PGSs disposed between the second PGS and the second sections of the multiple weaved PGS and above the first PGS.

14. The heat spreading element according to claim 9, wherein the first sections of the multiple weaved PGSs are parallel with the first PGS, the second sections of the multiple weaved PGS are parallel with the second PGS and the weaved sections of the multiple weaved PGSs are angled with respect to the first and second sections of the multiple weaved PGSs.

15. The heat spreading element according to claim 9, wherein the first sections of the multiple weaved PGSs are parallel with the first PGS, the second sections of the multiple weaved PGSs are parallel with the second PGS and the weaved sections of the multiple weaved PGSs are perpendicular with respect to the first and second sections of the multiple weaved PGSs.

16. The heat spreading element according to claim 9, wherein:

the first and second PGSs are each arranged to form multiple openings between multiple respective proximal ends thereof, and the multiple weaved PGSs comprise multiple weaved sections respectively extending through corresponding ones of the multiple openings.

17. A sandwich structure for an electronic assembly, comprising:

a core assembly comprising first and second sections and defining an opening between proximal ends thereof;

a first pyrolytic graphite sheet (PGS) disposed below the first section of the core assembly at a first side of the opening;

a second PGS disposed above the second section of the core assembly at a second side of the opening, which is opposite the first side of the opening; and a weaved PGS comprising:

a first section disposed above the first section of the core assembly at the first side of the opening;

a second section disposed below the second section of the core assembly at the second side of the opening; and a weaved section extending continuously between respective proximal ends of each of the first and second sections and through the opening.

18. The sandwich structure according to claim 17, wherein the weaved PGS is provided as an encapsulated annealed PGS.

19. The sandwich structure according to claim 17, wherein at least one or more of the first, second and weaved PGSs comprises a weave.

20. The sandwich structure according to claim 17, further comprising:

clamping plates sandwiching the core assembly, the first and second PGSs and the weaved PGS;

a clamping element to clamp the clamping plates together, and an electronic device disposed on one of the clamping plates and comprising a mounting boss extending into the core assembly.

* * * * *